United States Patent
Panagoplos et al.

(10) Patent No.: US 12,124,463 B2
(45) Date of Patent: *Oct. 22, 2024

(54) DATA STORAGE USING A BI-TEMPORAL INDEX

(71) Applicant: The Toronto-Dominion Bank, Toronto (CA)

(72) Inventors: Ty Peter Panagoplos, Toronto (CA); Daniel Martin Bosman, Morristown, NJ (US); Kaveh Ghahremani, Scarsdale, NY (US); Frederic Khai Dang Ngoc, New York City, NY (US)

(73) Assignee: The Toronto-Dominion Bank, Toronto (CA)

( * ) Notice: Subject to any disclaimer, the term of this patent is extended or adjusted under 35 U.S.C. 154(b) by 351 days.

This patent is subject to a terminal disclaimer.

(21) Appl. No.: 17/344,786

(22) Filed: Jun. 10, 2021

(65) Prior Publication Data

US 2021/0303566 A1  Sep. 30, 2021

Related U.S. Application Data

(63) Continuation of application No. 16/203,584, filed on Nov. 28, 2018, now Pat. No. 11,068,491.

(51) Int. Cl.
*G06F 16/2458* (2019.01)
*G06F 16/22* (2019.01)
(Continued)

(52) U.S. Cl.
CPC ...... *G06F 16/2477* (2019.01); *G06F 16/2282* (2019.01); *G06F 16/288* (2019.01); *G06F 16/9024* (2019.01); *G06F 30/20* (2020.01)

(58) Field of Classification Search
CPC ............ G06F 16/2282; G06F 16/2477; G06F 16/9024; G06F 16/288; G06F 30/20
See application file for complete search history.

(56) References Cited

U.S. PATENT DOCUMENTS 10,346,551 B2 * 7/2019 Mishra ............... G06F 16/9024
11,068,491 B2 * 7/2021 Panagoplos ......... G06F 16/2282
(Continued)

FOREIGN PATENT DOCUMENTS

CN    105528367 A    4/2016
CN    105893605 A    8/2016
(Continued)

OTHER PUBLICATIONS

Canadian Intellectual Property Office, Office Action, CA Patent Application No. 3,028,900, dated Dec. 12, 2019, six pages.

*Primary Examiner* — Marcin R Filipczyk
(74) *Attorney, Agent, or Firm* — Patent Capital Group

(57) ABSTRACT

A database system stores data in a bi-temporal index that maintains recordation time and a validity time for recorded values. The index for a given key may be append only, such that the stored data for the key doesn't require modification of previously-recorded data for given validity times. The bi-temporal index comprises a key-value data store that allows values to be recorded for a specific key, validity time, and recordation time. To retrieve a value, a request presents a query with a key, subject time, and observation time. Queries look for values with a validity time most recent to and before the queried subject time and a recordation time, associated with the validity time, most recent to and before the queried observation time. The queries prioritize the validity time over the recordation time and returns the value that satisfies the query request.

15 Claims, 8 Drawing Sheets

(51) Int. Cl.
    *G06F 16/28*     (2019.01)
    *G06F 16/901*     (2019.01)
    *G06F 30/20*     (2020.01)

(56) References Cited

U.S. PATENT DOCUMENTS

| | | |
|---|---|---|
| 2014/0172804 A1 | 6/2014 | Kaufmann et al. |
| 2015/0081719 A1 | 3/2015 | Ray et al. |
| 2015/0169697 A1* | 6/2015 | Kaufmann .......... G06F 16/2477     707/722 |
| 2016/0117727 A1* | 4/2016 | Campbell .......... G06Q 30/0256     705/14.54 |
| 2016/0292263 A1 | 10/2016 | Ferrar |
| 2018/0081943 A1* | 3/2018 | Johnson .............. G06F 16/2477 |
| 2020/0073977 A1* | 3/2020 | Montemerlo ....... G06F 16/9024 |

FOREIGN PATENT DOCUMENTS

| | | |
|---|---|---|
| CN | 107220285 A | 9/2017 |
| CN | 107451233 A | 12/2017 |

* cited by examiner

DATA STORAGE USING A BI-TEMPORAL INDEX

CROSS REFERENCE TO RELATED APPLICATIONS

This application is a continuation of co-pending U.S. application Ser. No. 16/203,584 entitled "Data Storage Using a Bi-Temporal Index" filed on Nov. 28, 2018, which is incorporated by reference in its entirety.

BACKGROUND

This invention relates generally to data storage, and more particularly, to storing data in an append-only bi-temporal index.

Key-value data storage systems store values in association with a given key. When data is presented for storage, a key is provided with the value to be stored, and to retrieve the value, the same key is presented to retrieve that data. The keys may be associated with or generated for particular purposes or users, to thus ensure that only a request with the same key may retrieve the stored value. The stored values may change over time as new requests to store a value are received. Accurate data storage and retrieval is important for ensuring the validity of data, to permit data correction, and to evaluate what was known about a given data item (e.g., for a given key) at a given time. Prior indexing typically required the validity data to be updated for a new valid end time, which could require reads and overwrites that were inefficient at high data volumes and could be inefficient to read and write values for a given key.

SUMMARY

A data storage system uses a bi-temporal index to maintain a record of values without the need to update stored values and to maintain data for previously-recorded data information. The bi-temporal index uses an append-only data store, which allows for users to access recent and older copies of data without requiring updates of previously-recorded data. This storage system allows a record of data for assessing validity over time while also maintaining a record of the most recent copy of data for a given time while permitting fast data entry and lookup.

The bi-temporal index database is a key-value database that stores a value in relation to a given key with a validity time and a recordation time. The validity time represents the beginning time at which the recorded value is valid for that key, while the recordation time is the particular time value at which the recorded value was recorded (or presented for recordation). Each key having stored information is maintained in the database with a data structure holding recordation time-validity time pairs and associated values for each pair.

To store a value for a key, the storage request may specify the relevant key, value, validity time, and recordation time. In some embodiments, the request does not specify the recordation time or an end validity time for the stored value. The stored data can be represented as a graph to illustrate the stored validity times and recordation times for a given key. The x-axis corresponds to the validity or "valid from" time and the y-axis corresponds to the "recordation timestamp," or recordation time. Each location on the graph thus corresponds to a particular combination of validity time and recordation time. Data represented at particular locations on the graph are also referred to as points or validity-recordation time pairs. Points are stored in an append-only data store in validity-recordation time pairs and include (or have a reference to) the stored value. In another embodiment, the validity-recordation time pairs are stored as a set of validity times, each validity time having a set of associated recordation times. In each of these approaches, the stored validity-recordation time pairs may be ordered by validity time to speed storage and retrieval.

To retrieve a value, a query request presents a query including a key, a subject time, representing the queried—for time of valid data (e.g., specifying a request for the value "at" a given time, such as the value of the key on Tuesday), and an observation time, representing the time at which data for the subject time would have been known (e.g., data for the subject time was known "as of" the observation time). The time at which a query was submitted may be referred to as a query time. For example, a query requested on August 31 for a subject time of August 1 with an observation time of August 15 is a query received on August 31 that requests what was known on August 15 for the value of on August $1^{st}$.

The subject time is also referred to as the "at" time and the observation time is also referred to as the "as of" time. The query's subject time or "at" time refers to the time for when which a query is being sought after. For example, the August 1 is the subject time in the example above. Though "as of" is often used to query for a value as known today, it allows queries to specify a vantage point from which information about the subject time was known. Both the validity time and the observation time can be used to look at values before the query time. With respect to the graph representation, the query's subject time corresponds to a location on the "valid from" (validity time) axis and the observation time corresponds to a location in the "recordation timestamp" axis.

Queries can be projected on the recordation timestamp-valid from axis and then evaluated "left and down" to find the corresponding entry/value. This means that both the "recordation timestamp" and the "valid from" times given in the query will be further in time than the corresponding point on the graph for the given key. The retrieved value can be used to compare and identify any corrections made in the stored values and understand what value was known at what time. To query the stored data, the stored set of recorded values is traversed first by validity time, then by recordation time. During the traversal of the validity time, the storage system identifies a validity time less than and most recent to the subject time in the query and a recordation time less than and most recent to the observation time in the query. The traversal will thus continue past a validity time (to check subsequent earlier validity times) when the validity time is before the queried subject time but does not have a recordation time before the queried observation time.

As a result, this approach permits the entry of a new storage request by just appending the new validity-recordation time pair, and does not require modification of other entries for a key. Likewise, identifying a value for retrieval can be quickly performed by traversing the stored set of data for the relevant validity-recordation time pair and returning the associated value.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Figure 1:
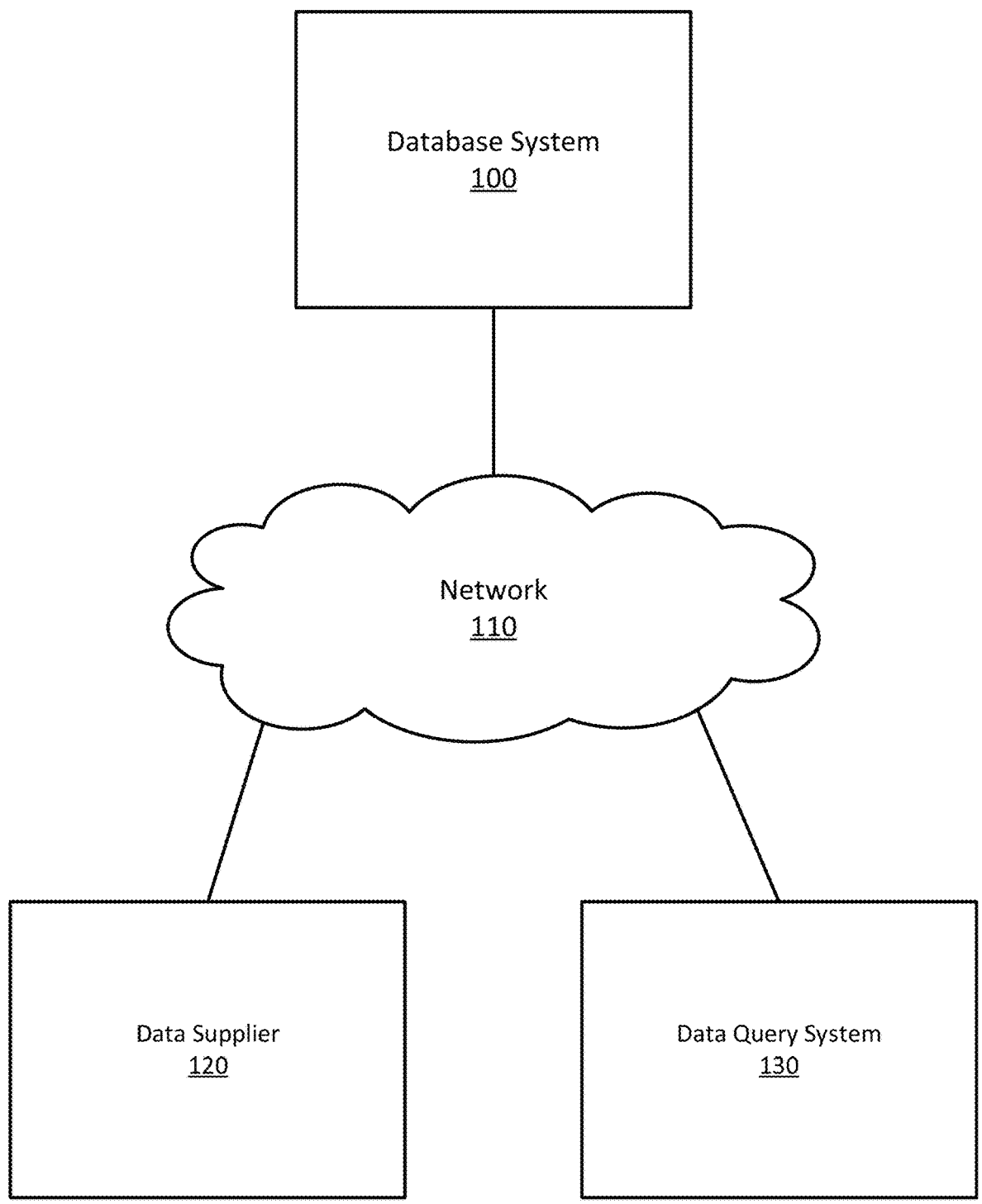
FIG. 1 illustrates a system environment and architecture for a database system 100, in accordance with some embodiments.

FIG. 1 illustrates a system environment and architecture for a database system 100, in accordance with some embodiments. The illustrated system environment includes a database system 100, a data supplier 120, a data query system 130, and are in communication via a network 110. The database system 100 receives storage requests from the data supplier 120 and responds to queries from the data query system 130. In alternative embodiments, other components may be included in the system environment. In addition, these systems are shown in this configuration to aid in understanding of this disclosure, and the functions of various systems may also be combined. For example, the data supplier 120 and data query system 130 in embodiments may be components of the same system, or may be components of the database system 100. For example, a server system operating as the database system 100 may store data within an organization that also generates data for storage as the data supplier 120 that may be queried by users within the organization via the data query system 130.

The database system 100 maintains key-value records, receives requests to store data, and stores data in a key-value store. The database system 100 stores data as a bi-temporal index. The bi-temporal index is a key-value data store that stores values from the data supplier 120 under a given key. The values are stored for a key in relation to a validity time (a "valid from" time) and a recordation time (a "recorded at" time). The validity time is the time at which the value for the given key was last expected to be true, verified, or "valid from." For example, a validity time of 3 means that the value was "valid from" or true as of time 3 onward (until a subsequent validity time). In an embodiment, the values are also stored with a "valid to" time, which is the time which the value is verified until or "valid to." The recordation time is the time at which the given value was recorded. In this case, a recordation time of 2 indicates that the value was recorded at time 2. The key is a value, such as a string of text or numeric value, that is used to store and access values for the same key. That is, the same key that was used to store data typically must be presented for retrieval of the stored data. Likewise, the stored value may be any data type that may be stored by the database system 100, and may or may not be structured or have defined types. The database system 100 uses validity times and recordation times with a particular key to respond to queries and provide valid data for a desired time as known at a given observation time.

The validity time and recordation time may be used together to reflect what was known about the value for a key at a given time. As a recordation time moves forward in time, requests may specify validity times that may be the same, earlier, or later than the recordation time. A later validity time may represent a prediction about a future value, while an earlier validity time may represent some delayed or corrected information about a value for a past time. For example, a given validity time may be specified in multiple requests. A first request for a validity time on day 1 could be recorded on day 1, while a subsequent request for the same validity time (day 1) could be recorded on day 5. By recording both the validity time and when the value was recorded (i.e., the recordation time), this database may provide storage and effective retrieval of information to demonstrate not just the value at a given time, but when that value was known or corrected. The combination of validity time and recordation time is referred to as a validity time-recordation time pair. Each validity time-recordation time pair may be stored in a data structure associated with the designated key. These pairs may be stored in the data structure and ordered by validity time, permitting query of the data structure by validity time as discussed below.

The data supplier 120 sends data storage requests. The data supplier 120 represents a source of data, such as a server or other computer that provides data for recordation by the database system 100. The requests may be sent as a stream of requests or may be generated at a designated frequency and can represent various evaluations or measurements according to the needs of the data supplier. Example types of data that may be used in for the key-value database include transaction data, account management data, sensor data, and so forth. To store data, the data supplier 120 generates data storage requests and sends them to database system 100. Data storage requests include a key, value, and a validity time. In various configurations, the data storage request may also include a recordation time, or the recordation time may be determined by the database system 100.

As one example discussed in this application, the data may be temperatures for a region. Such temperatures may be forecasted to the future, recorded on a given day, or corrected for prior days. As example uses of the "validity time," for temperatures, the data supplier 120 on a single day (day 5) may send requests affecting multiple validity times that reflect information as follows:

Validity time day 5, value 75. The temperature reading on day 5 is 75.

Validity time day 1, value 71. A correction to the historical reading of day 1, which should be 71.

Validity time day 9, value 82. A forecasted value for future day 9 is 82.

By capturing these various validity times and when they were recorded, the database system 100 can provide responses to queries reflecting the most recently-recorded, valid data at a given point in time. Thus, the database system 100 can answer queries such as "what was known on day 6 for the temperature on day 2?"

The data query system 130 provides data query requests. Each query request includes a key, a subject time, and an observation time. The subject time is the time requested in the query for valid data. For example, if the subject time is "day 3," the query is requesting the value for a given key that was valid on day 3. The observation time is the time requested by the query for which the value of the subject time would have been known, the value for the given subject time being known "as of" the observation time. Queries may be generated automatically or by user request.

In one embodiment, the data query system 130 includes logic for determining modification times for a given subject time. Depending on the configuration, the data query system 130 may provide various types of responses to queries. For example, in one embodiment the data query system 130 may provide the value corresponding to the request, which may optionally include the recordation time and validity time associated with the returned value (or may indicate that no valid value exists). In another embodiment, the data query system 130 may include ways to compose a more complex set of queries to the storage system to generate additional information about the stored data, such as to determine when the data was modified for a given subject time. A variety of queries can be implemented by the logic in the data query system. Example logic for these queries is discussed with respect to the data query module 210 in FIG. 2.

The response to a query includes a value for the subject time as of the observation time. In one embodiment, the response may include only a value. In another embodiment, the response may include the relevant validity time and recordation time of the point at which the value was stored. The response may also include all prior recordation times and values for the most recent validity time, in an alternate embodiment.

As discussed above, in another embodiment, the data query system 130 and the data supplier 120 may be the same system. The data query system 130 and the data supplier 120 may also be integrated into the data storage system in a different embodiment. In general, the data query system 130 and the data supplier 120 of FIG. 1 are used to represent functions for data storage and data query requests, though the configuration of the systems may vary depending on the embodiment.

Figure 2:
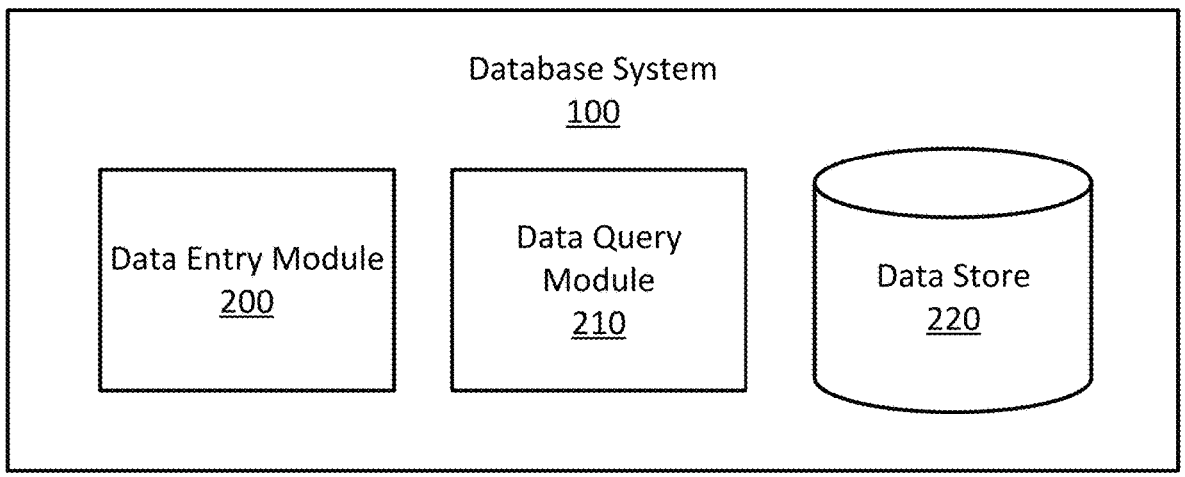
FIG. 2 shows components of the database system 100 according to one embodiment.

FIG. 2 shows components of the database system 100 according to one embodiment. The database system 100 includes a data entry module 200, a data query module 210, and data store 220, according to one embodiment. The modules and data store of database system 100 service data storage requests and data query requests. The separate modules and configuration shown in FIG. 2 is for convenience in illustrating operation of the database system 100 and may in practice includes additional or fewer components that may be disposed at separate locations. For example, though shown here as a single data store 220 within the database system 100, the data store 220 may be disposed across many individual data storage components that may be accessible via a network or data storage network, and may include data duplication and redundancies and other features.

The data store 220 is a storage medium for the data structures of each key and associated values for the stored information of the database system 100. For each key having values, the data store 220 maintains a data structure for organizing the bi-temporal data for the stored values. In one embodiment, the data structures of the data store 220 are append-only, so that the data structure for each key does not overwrite or erase stored data. The data store 220 stores values for a given key under the corresponding validity and recordation times. Within the data structure for each key, validity-recordation time pairs are ordered first by validity time, then by recordation time. Each validity-recordation time pair may is associated with a stored value, which may be stored with the validity-recordation time pair, or the associated value may be stored at a memory location referenced by the time pair. The data store is structured in validity-recordation time pairs, shown in FIG. 3. Though termed a "validity-recordation time pair" the data store 220 may not explicitly store the data structure as a pair. For example, in another embodiment, each validity-recordation time pairs is represented by a set of validity times and each validity time in the set of validity times has an associated set of recordation time-value pairs, as shown in FIG. 4. As examples, the validity-recordation time pairs may be stored as a list, for example as a SkipList or a SkipList Set.

The data entry module 200 receives requests for new data storage. For example, when a data storage request is provided by the data supplier 120. The data entry module 200 identifies the recordation time for the request, either by identifying the current time as the recordation time, or by using a recordation time specified in the request. The data entry module 200 then accesses the data structure for the designated key and adds a new validity-recordation time pair to the data structure. Since the data structure is ordered, the new data validity time is added to the data structure at the ordered location for its validity time and recordation time. This addition is further discussed in FIGS. 3A-3D. As the data structure is ordered and append-only, additional items can be added quickly to the data structure for a key.

The data query module 210 receives and processes queries for the database. For a given key, the data query module 210 uses a subject time with respect to a recordation time to query the data store 220. The data store stores data by validity time and recordation time. For queries, the subject time corresponds to the validity time in the data store and the observation time corresponds to the recordation time. The data query module 210 traverses the data first by validity time given the corresponding subject time, then by recordation time given the corresponding observation time. The data query module 210 thus may traverse the data structure to identify a validity time most-closely before the subject time. Since this validity time potentially has valid data, the data query module 210 next determines whether there is a recordation time before the designated observation time. That is, whether data was recorded before the time specified in the query. When a validity time before the subject time does not have a recordation time before the observation time, the data query module 210 continues to traverse to an earlier validity time.

The data query module 210 may pose different types of questions depending on the information provided in the queries and the logic of the data query module 210. The data query module 210 queries the data store to see how data for a given key changed depending on when the values were recorded and when they were verified. For example, the data query module 210 may query the data store to see the values at recordation time 15 were recorded for validity time 8, validity time 9, and validity time 10, yielding values of 67, 75, and 75. In this case, the query may show that the values for these dates were corrected at recordation time 15. Additionally, the data query module may query the data store to see that there are two values stored at validity time 8. The first, with a recordation time of 3, is 75, and the second, with a recordation time of 6, is 67. This may be used to show that the value was updated at time 6 to reflect the correct value for that validity time at known at recordation time 6.

FIGS. 3A-3D depict an example bi-temporal graph 300 of a recordation time 310 versus a validity time 320 for key "ei87vnx2" 330. The current time 340 represents the current time that progresses as requests to store data are received. The current time 340 illustrates that the recordation time 310 always increases, although data recorded at a particular time may refer to any validity time 320. As noted above, the validity time may reflect a current value, a previous value (e.g., a correction), or may reflect a forecast or prediction of a future value, each of which may be "valid" until a later storage request updates that value. The recordation time and validity time is a specific time value, such as a timestamp or date, and may be represented in seconds, milliseconds, minutes, hours, or the like. The data structure 350 illustrates the method of storing data as validity-time pairs and shows how the data is ordered as more data is added to the data structure 350.

Figure 3A:
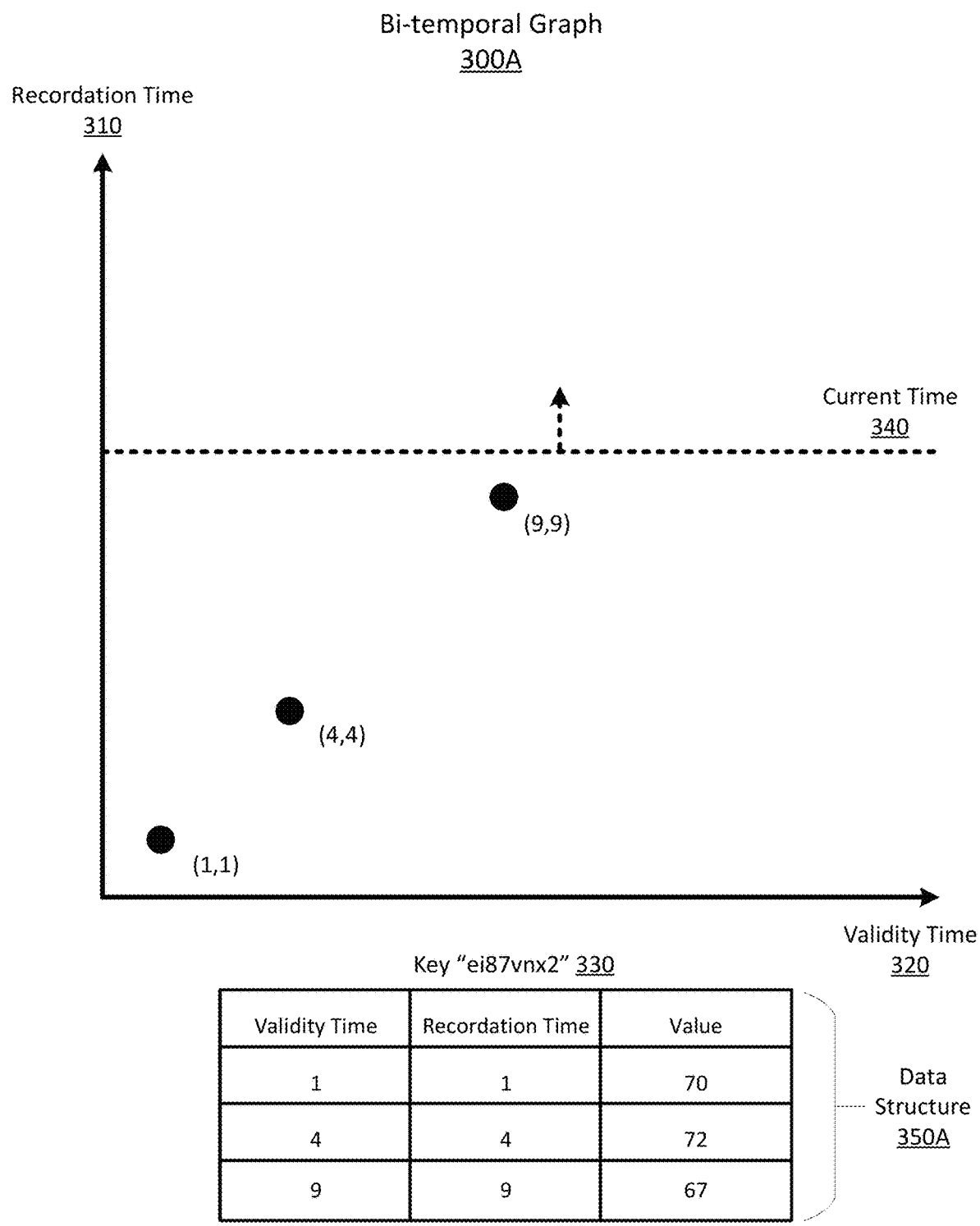
FIGS. 3A-3D depict an example bi-temporal graph of recordation time versus validity time for a key and example queries according to one embodiment.
Figure 4:
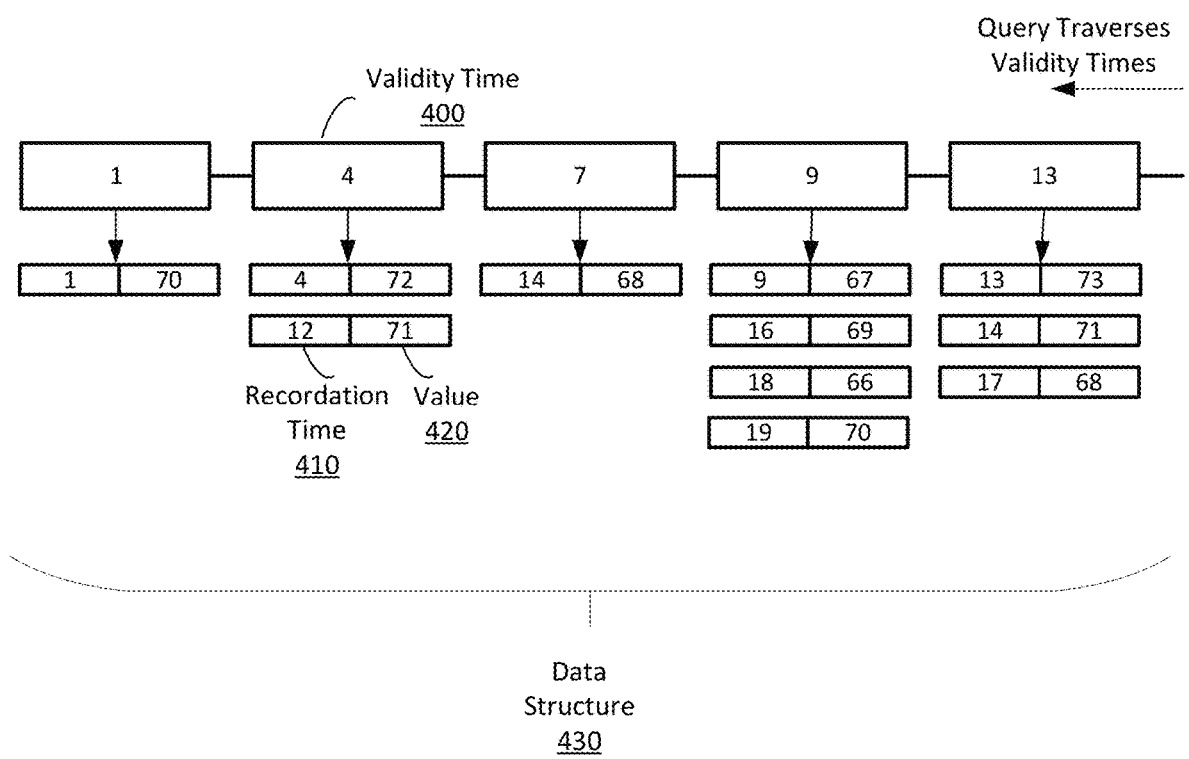
FIG. 4 is another embodiment of the data structure for validity-recordation time pairs.

FIG. 3A illustrates an example of a bi-temporal graph 300A where new points are added for stored values. In this initial example, a value is recorded to be valid from the time that the value is recorded. The current time 340 represents the real-world time, shown on the recordation time 310 axis, and illustrates that the recordation time 310 always increases, but the current time 340 could refer to any validity time 320. In this example, the current time 340 value is 10. However, typically, the recordation time 310 does not need to be the same as the validity time 320, but the recordation time 310 cannot be before the current time 340. For example, data from Friday could be recorded on Sunday, which may have a validity time of Friday but a recordation time of Sunday. Alternatively, data recorded today could be "valid from" a future time, representing recording an expected future value that may change, such as a weather prediction. Additional entries for that validity time may be added when new forecasts are generated and when temperatures are generated to represent another day's prediction about that day.

The data structure 350A contains the three points depicted on the bi-temporal graph 300A. The points are stored in validity-recordation time pairs that point to the associated values for the key 330. As shown, the data structure 350 and the visualized graph 300 may represent data structures for a specific key 330, in this example the key having a value ei87vnx2. The points as stored in the data structure 350 are ordered by increasing validity time 320.

Figure 3B:
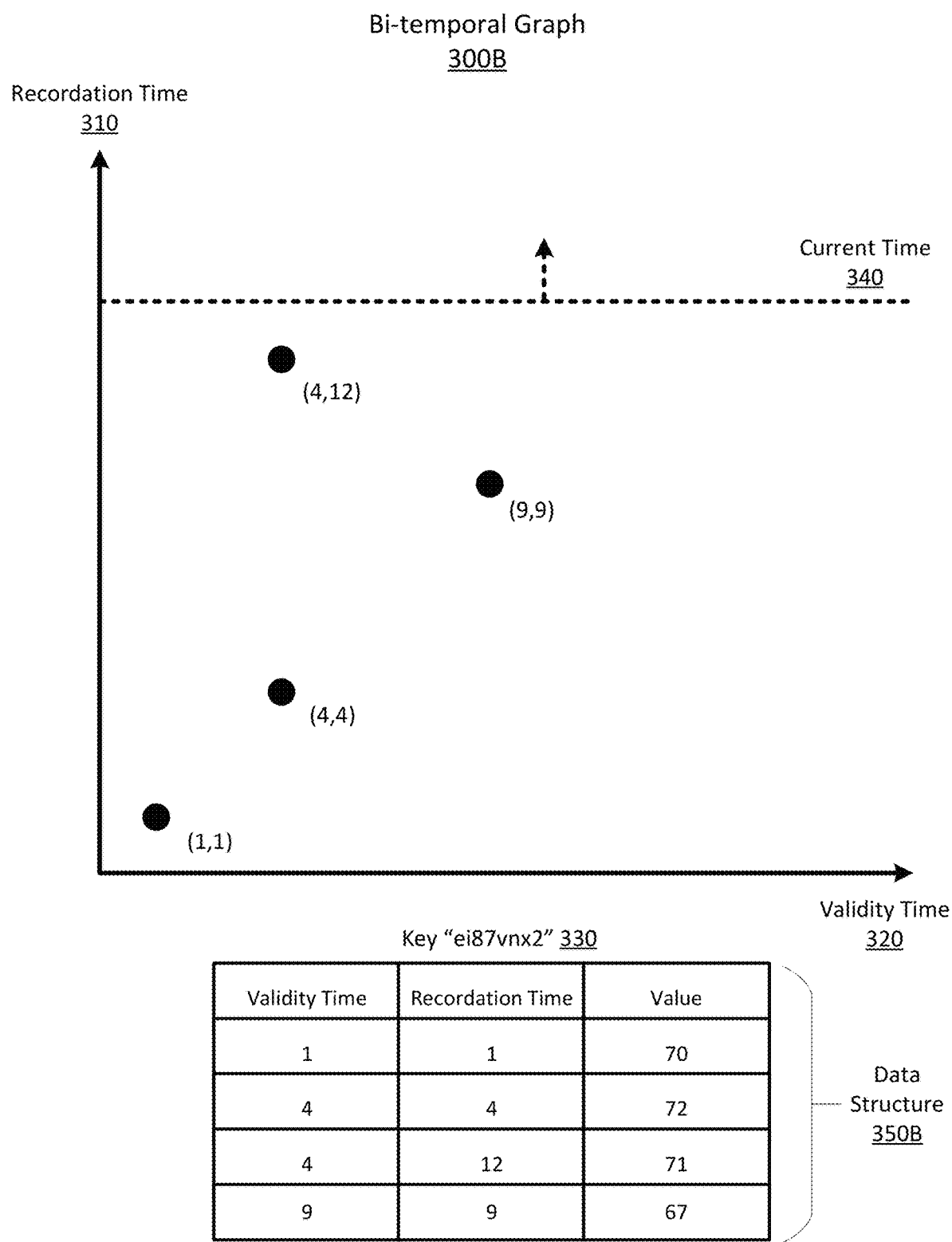

FIG. 3B illustrates an updated version of the bi-temporal graph 300A from FIG. 3A with an additional entry of validity time 4 and recordation time 12 added to the bi-temporal graph 300B and the data structure 350C. The current time 340 has moved forward to a current time 340 value of 13. The bi-temporal graph 300B shows updating a value for a time with new recordation time 310. In this case, the value at the validity time 320 of 4 was updated at a recordation time of 12. This new point (4,12) was appended to the bi-temporal graph 300B and the data structure 350B. Since the data structure 350B is ordered by validity time 320, followed by recordation time 310, the validity-recordation time pair and associated value data is appended in between the points (4,4) and (9,9).

Figure 3C:
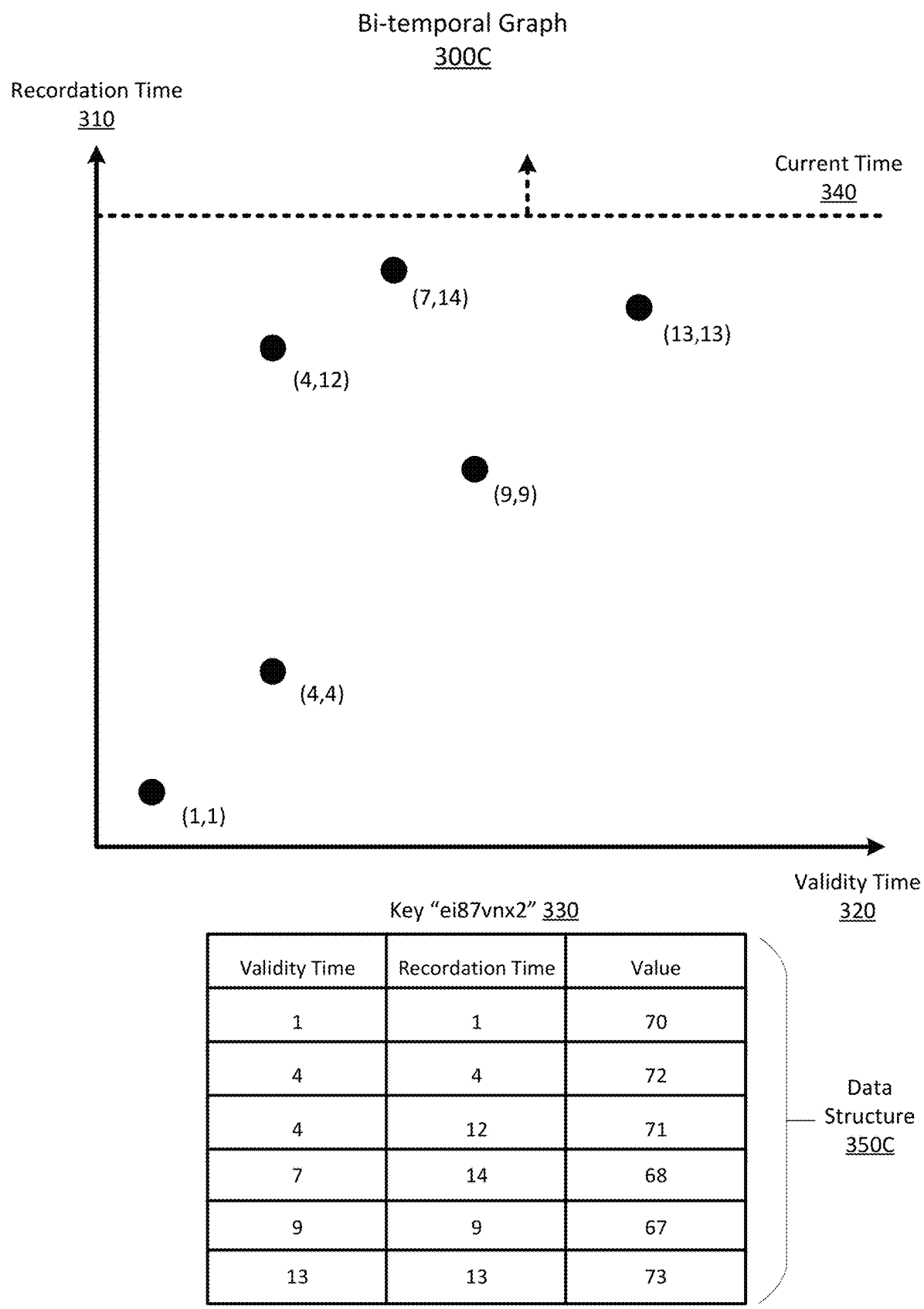

FIG. 3C illustrates an updated version of the bi-temporal graph 300B from FIG. 3B with more data added to the bi-temporal graph 300C and the data structure 350C. Two more points at new validity times 320 were appended to the bi-temporal graph 300C and the data structure 350C. The current time 340 value is 15. One new point is appended with a recordation time of 13 with a validity time of 13, and another new point is appended with a recordation time of 14 and a validity time of 14. The points added have later recordation times 310 than the previous points from the bi-temporal graph 300B from FIG. 3B. The points added to the data structure 350C are appended such that they are still ordered first by validity time 320, then by recordation time 310. Accordingly, in this example, though recorded last, the validity-recordation time pair for validity time 7 and recordation time 14 is ordered before the recordation time 9, validity time 9, pair in the data structure of key 330 of data structure 350C.

Figure 3D:
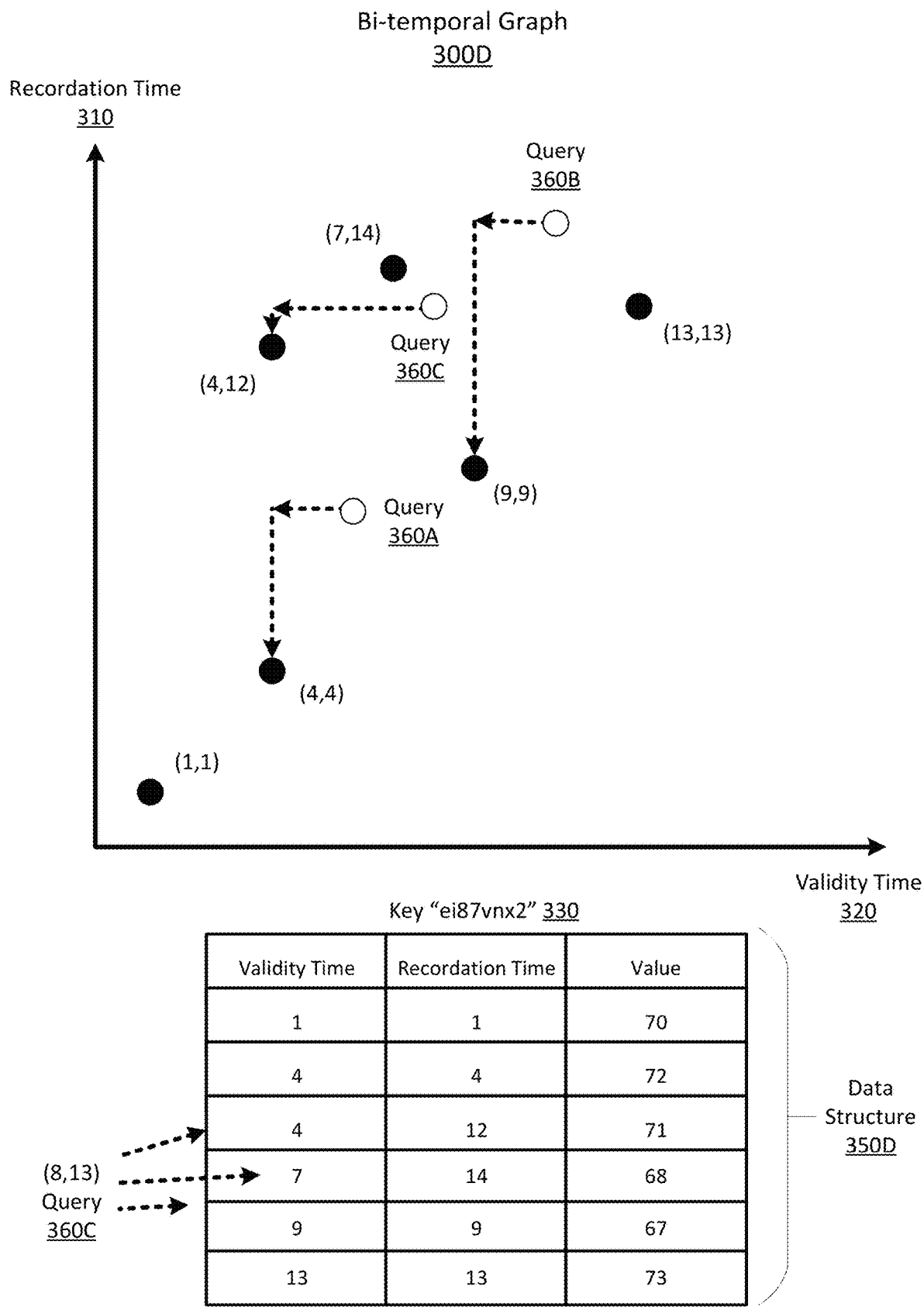

FIG. 3D illustrates querying the data store using the bitemporal graph 300C from FIG. 3C. The example queries 360A-C each have a given subject time and observation time and are represented as points on the bi-temporal graph 300D. The queries 360 illustrate the process of finding points "left and down" from the query to retrieve data with a validity time 320 most recent to and before the queried subject time and a recordation time 310 most recent to and before the queried observation time. The query first traverses the data by validity time 320, then by recordation time 310. Query 360A, at point (6,8), illustrates an example of this method. The query 360A traverses the data structure 350D to find the point (4,4) with a value of 72 as the answer to the query 360A such that the resulting validity-recordation pair meets the constraints of having both validity time 320 most recent to and before the queried subject time and a recordation time 310 most recent to and before the queried observation time.

The queries 360 prioritize the validity time 320 over the recordation time 310, such that the queries 360 first look for a qualifying validity time 320 before searching for a qualifying recordation time 310 for the qualifying validity times 320. This prioritization results in earlier recorded data for a later validity time 320 being chosen by the query 360 over an earlier validity time 320. For example, query 360B, located at point (11,15), resolves to point (9,9) with a value of 67 instead of point (7,14) since the validity time 320 of point (9,9) is later in time than the validity time 320 of point (7,14). In this embodiment, a given validity time is considered to be controlling until a subsequent validity time is recorded, even if an earlier validity time is recorded later. Accordingly, the data structure 350 can be ordered by validity time (and accordingly traversed) to quickly identify the relevant value for a given query. In another embodiment, the queries prioritize the recordation time 310 over the validity time 320. In this embodiment, the data structure may order the validity-recordation time pairs within the data structure by recordation time and then by validity time, such that recordation time may be traversed first.

Query 360C illustrates a more complex query resolution than query 360A and query 360B. To resolve the query 360C, specifying a subject time of 8 and observation time of 13, reflecting point (8,13) on the bi-temporal graph 300D, the data query module 210 first traverses the data structure 350D to identify a first validity-recordation time pair having a validity time before the specified subject time. As the data query module 210 traverses the data structure for a prior validity time, the query 360C first encounters the validity-recordation time pair (7,14) having a validity time before the subject time. However, the recordation time 310 of 14 for the point (7,14) is later than the observation time of the query 360C point (8,13). Therefore, the query 360C continues to traverse the data structure and finds the next validity time of 4 at the validity-recordation time pair (4,12), which also has a qualifying recordation time 310 for the query. Thus, when a validity time is identified, the recordation times may be traversed for that validity time, and when no recordation times are before the validity time, the data structure may continue to be traversed for a prior validity time having a recordation time before the queried observation time.

The queries 360 traverse the data structure 350D with the validity-recordation time pairs by also prioritizing validity time 320 over recordation time 310. The queries 360 traverse the data starting with the point with the latest validity time 320 and latest recordation time 310 for that validity time 320. For example, query 360C starts traversing the data at the validity time 320 of 13. The time is not before the subject time of the query 360C, so the query 360C continues traversing through the data structure 350D. The query continues this process of traversing through the validity times 320 backwards in time and eventually reaches the validity time 320 of 7, which is before and most recent to the subject time of the query 360C. The query 360C then traverses the recordation times 310 for the validity time of 7. However, since the recordation time is 14, which is after the observation time of the query 360C, the query resolution continues to traverse the data structure validity times for validity times less than 7. The query 360C finds the validity time of 4, and, upon traversing the associated recordation times 310, finds the recordation time of 12. This recordation time 310 is most recent to and before the observation time of the query 360C for the recordation times associated with the validity time 320 of 4, so the query returns the value associated with the point (4,12), or 71. In another embodiment, the queries 360 traverse the data forwards in time. Because the validity and recordation times can be linked in the data structure, the relevant validity-recordation time pair, in some embodiments, is the first pair encountered in the traversal that satisfies both the queried subject time and queried observation time.

FIG. 4 is another embodiment of the data structure 430 in FIG. 3 with additional validity-recordation time pairs. In this embodiment, each validity time has a set of associated recordation times, the combination of which represents the validity-recordation time pair. In this example, the data structure 430 stores a set of validity times, each having an associated set of recordation times. Queries traverse the data first by validity time, or horizontally in FIG. 4, then by recordation time, or vertically in FIG. 4. Queries traverse the validity times 400 backwards in time, in one embodiment. In another embodiment, the queries traverse the validity times 400 forwards in time. Queries prioritize the validity time 400 over the recordation time 410, so a query first traverses the validity times 400 to find a validity time 400 most recent to and before the subject time of the query, before traversing the recordation times 410 in the set associated with the chosen validity time 400. If the first recordation time 410 is after the observation time of the query, the query can skip the column for that validity time 400 and moves to the next validity time (since the "earliest" recordation time may be first in the order). Once the query finds both a qualifying validity time and a qualifying recordation time that satisfies the constraints, the query returns the associated value 420.

Figure 5:
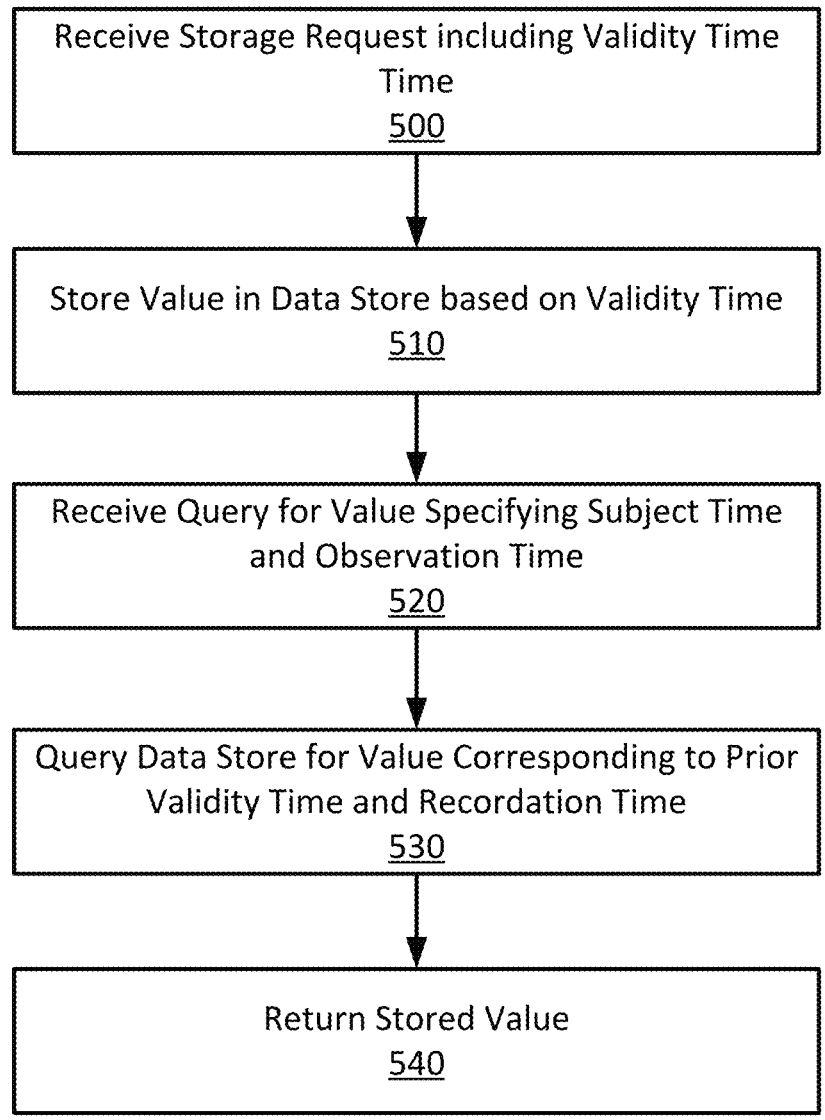
FIG. 5 is a flowchart of example data storage and retrieval for a bi-temporal index data store.

FIG. 5 is a flowchart that represents how data is stored and received within the system. The system first receives 500 a storage request for a value at a specific key and validity time. In some embodiments, the storage request also includes an explicit recordation time. The system then stores 510 the value in the data store based on the validity time and recordation time. When the system receives 520 a query for a value, the query contains a subject time and an observation time, which can be used to find a value in the data store for a corresponding validity time and recordation time. The system queries 530 the data store using the given query to find a value corresponding to a prior and most recent validity time and a prior and most recent recordation time. Once the system finds a qualifying validity-recordation time pair, the system returns the value associated with that validity-recordation time pair.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the invention may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A system for bi-temporal data retrieval, the system comprising:
  a processor; and
  a non-transitory computer-readable storage medium containing computer program code for execution by the processor and causing the processor to:
    receive a query for a value of a key at a subject time with respect to an observation time, the query specifying at least the subject time and the observation time;
    identify a data structure associated with the key in the data store, the data structure having a set of validity-recordation time pairs grouped into a plurality of recorded validity times, each validity-recordation time being associated with a stored value;

traverse the data structure backwards in reverse chronological order first by validity time and second by recordation time by:
  identifying a first recorded validity time, of the plurality of recorded validity times, before and closest to the subject time;
  determining that no validity-recordation time pairs having the first recorded validity time have a recordation time before the observation time;
  responsive to the determination, identifying a second recorded validity time, of the plurality of recorded validity times, before the first recorded validity time; and
  identifying a validity-recordation time pair having a validity time matching the second recorded validity time and a recordation time before and closest to the observation time;
retrieve the stored value associated with the identified validity-recordation time pair as a response to the query; and
return the retrieved value in response to the query.

2. The system of claim 1, wherein the data structure is a skip list or a skip list set.

3. The system of claim 1, wherein the data store is stored in an append-only database.

4. The system of claim 1, wherein traversing the data structure includes stopping the traversal after identifying the validity-recordation time pair.

5. The system of claim 1, wherein the computer program code further causes the processor to store a new value for the key at a validity time before the current recordation time, the validity time associated with a previous value stored at the validity time for an earlier recordation time, the new value indicating a modification in the data for the key since the previous value was recorded.

6. A method for bi-temporal data retrieval executed by a processor, comprising:
  receiving a query for a value of a key at a subject time with respect to an observation time, the query specifying at least the subject time and the observation time;
  identifying a data structure associated with the key in the data store, the data structure having a set of validity-recordation time pairs grouped into a plurality of recorded validity times, each validity-recordation time being associated with a stored value;
  traversing the data structure backwards in reverse chronological order first by validity time and second by recordation time by:
    identifying a first recorded a validity time, of the plurality of recorded validity times, before and closest to the subject time;
    determining that no validity-recordation time pairs grouped with having the first recorded validity time have a recordation time before the observation time;
    responsive to the determination, identifying a second recorded validity time, of the plurality of recorded validity times, before the first recorded validity time; and
    identifying a validity-recordation time pair having a validity time matching the second recorded validity time and a recordation time before and closest to the observation time;
  retrieving the stored value associated with the identified validity-recordation time pair as a response to the query; and
  returning the retrieved value in response to the query.

7. The method of claim 6, wherein the data structure is a skip list or a skip list set.

8. The method of claim 6, wherein the data store for the key is stored in an append-only database.

9. The method of claim 6, wherein traversing the data structure includes stopping the traversal after identifying the validity-recordation time pair.

10. The method of claim 6, wherein a new value for the key may be stored at a validity time before the current recordation time, the validity time associated with a previous value stored at the validity time for an earlier recordation time, the new value indicating a modification in the data for the key since the previous value was recorded.

11. A non-transitory computer-readable storage medium for bi-temporal data retrieval, the non-transitory computer-readable storage medium storing instructions that when executed by a processor cause the processor to:
  receive a query for a value of a key at a subject time with respect to an observation time, the query specifying at least the subject time and the observation time;
  identify a data structure associated with the key in the data store, the data structure having a set of validity-recordation time pairs grouped into a plurality of recorded validity times, each validity-recordation time being associated with a stored value;
  traverse the data structure backwards in reverse chronological order first by validity time and second by recordation time by:
    identifying a first recorded validity time, of the plurality of recorded validity times, before and closest to the subject time;
    determining that no validity-recordation time pairs having the first recorded validity time have a recordation time before the observation time;
    responsive to the determination, identifying a second recorded validity time, of the plurality of recorded validity times, before the first recorded validity time; and
    identifying a validity-recordation time pair having a validity time matching the second recorded validity time and a recordation time before and closest to the observation time;
  retrieve the stored value associated with the identified validity-recordation time pair as a response to the query; and
  return the retrieved value in response to the query.

12. The non-transitory computer-readable storage medium of claim 11, wherein the data structure is a skip list or a skip list set.

13. The non-transitory computer-readable storage medium of claim 11, wherein the data store for the key is stored in an append-only database.

14. The non-transitory computer-readable storage medium of claim 11, wherein traversing the data structure includes stopping the traversal after identifying the validity-recordation time pair.

15. The non-transitory computer-readable storage medium of claim 11, wherein a new value for the key may be stored at a validity time before the current recordation time, the validity time associated with a previous value stored at the validity time for an earlier recordation time, the new value indicating a modification in the data for the key since the previous value was recorded.

* * * * *